United States Patent
Plikat et al.

(10) Patent No.: US 6,777,748 B1
(45) Date of Patent: Aug. 17, 2004

(54) BI-DIRECTIONAL SEMICONDUCTOR COMPONENT

(75) Inventors: Robert Plikat, Eningen (DE); Wolfgang Feiler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/031,526

(22) PCT Filed: Jun. 24, 2000

(86) PCT No.: PCT/DE00/02061

§ 371 (c)(1),
(2), (4) Date: May 9, 2002

(87) PCT Pub. No.: WO01/06567

PCT Pub. Date: Jan. 25, 2001

(30) Foreign Application Priority Data

Jul. 20, 1999 (DE) .......................... 199 33 969

(51) Int. Cl.⁷ .................... H01L 29/76; H01L 29/74; H01L 31/111; H01L 23/58; F02P 3/12
(52) U.S. Cl. ................. 257/343; 257/119; 257/141; 257/162; 257/492; 257/493; 123/651
(58) Field of Search ................ 257/119, 141, 257/162, 343, 492, 493; 123/651, 652, 650

(56) References Cited

U.S. PATENT DOCUMENTS 5,793,064 A   8/1998  Li
5,970,965 A  * 10/1999  Bentel et al. ............... 123/651

FOREIGN PATENT DOCUMENTS

EP            0 848 161          6/1998

OTHER PUBLICATIONS

Xu S et al., *Bidirectional LIGBT on SOI Substrate with High Frequency and High Temperature Capability*, IEEE International Symposium on Power Semiconductor Devices and ICS, Bd. Conf. 9, New York, United States, May 26, 1997.

* cited by examiner

Primary Examiner—Steven Loke
(74) Attorney, Agent, or Firm—Kenyon & Kenyon

(57) ABSTRACT

A bidirectional semiconductor component having two symmetrical MOS transistor structures integrated laterally in a substrate and connected antiserially, their drain terminals being connected to one another. A zone having the same type of conductivity as the drain region yet a higher doping than that of the drain region is situated upstream from a pn junction of one of the MOS transistors in a junction area with the drain region.

8 Claims, 2 Drawing Sheets

BI-DIRECTIONAL SEMICONDUCTOR COMPONENT

The present application is a National Phase Application Under 35 U.S.C. § 371 of PCT International Application No. PCT/DE00/02061, filed Jun. 24, 2000.

FIELD OF THE INVENTION

The present invention relates to a bidirectional semiconductor component having two symmetrical MOS transistor structures in an antiserial configuration, integrated laterally into a substrate, their drain terminals interconnected.

BACKGROUND INFORMATION

Bidirectional semiconductor components of the generic type are described in S. Xu et al. in "Bidirectional LIGBT on SOI substrate with high frequency and high temperature capability" IEEE, 2/97. Due to the completely symmetrical design described there in combination with the antiserial configuration of the MOS transistors, the known bidirectional semiconductor component is suitable for use as a matrix switch in telecommunications systems or the like. Asymmetrical applications, such as those in automotive ignition system control circuits, cannot be implemented by the known bidirectional semiconductor components because the required blocking ability of approx. 400 V can be achieved only asymmetrically at the present time.

SUMMARY OF THE INVENTION

The bidirectional semiconductor component according to the present invention offers the advantage over the related art that it is possible to implement blocking voltages of different levels. An asymmetrical blocking ability may be achieved with a simultaneous guarantee of a low resistance at powerup due to the fact that a zone having the same type of conductivity as the drain region, however, having a higher doping than the drain region, is located upstream from a pn junction of one of the MOS transistors in a junction area with the drain region.

Due to the advantages achievable with the design of the bidirectional semiconductor component according to the present invention, it is especially suitable for use as a short-circuit switch for short circuiting a primary winding of an ignition coil in an ignition system of a motor vehicle. It is known that with an ionic current ignition, the primary winding of the ignition coil is to be short-circuited by the secondary winding of the ignition coil after the ignition pulse has been triggered on a sparkplug because extinction of the spark is defined by this short-circuiting. In this use as provided according to the present invention, the bidirectional semiconductor component used as a short-circuit switch receives blocking voltages of different levels, namely the battery voltage on the one hand and the terminal voltage of a transistor stage connected as a Darlington, for example, on the other hand. According to the buffering of the pn junction of the one MOS transistor provided with the bidirectional semiconductor component according to the present invention, it is possible to achieve an asymmetrical blocking ability of the semiconductor component by way of which the different blocking voltages can be compensated for.

DETAILED DESCRIPTION

Figure 1:
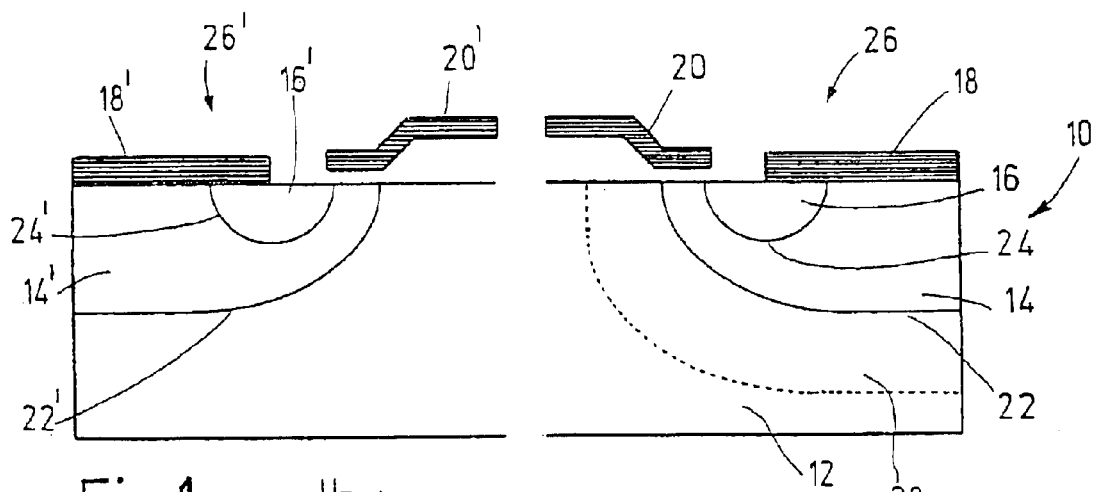
FIG. 1 shows a schematic view of a bidirectional semiconductor component according to the present invention.

FIG. 1 shows a schematic block diagram of a bidirectional semiconductor component 10. Bidirectional semiconductor component 10 includes a substrate 12 having a first charge carrier doping (e.g., n-type doping). Charge carrier regions 14 and 14' having a charge carrier doping (e.g., p-type doping) opposite the first charge carrier doping are integrated into substrate 12. Charge carrier regions 14 and 14' are symmetrical. Charge carrier regions 16 and 16' having the same charge carrier doping as substrate 12 (e.g., n-type doping) are integrated into charge carrier regions 14 and 14'. Charge carrier regions 14 and 16 are electrically connected to a common metallic coating (electrode) 18 and charge carrier regions 14' and 16' are electrically connected to a common metallic coating (electrode) 18'. Furthermore, charge carrier region 14 is provided with another insulated electrode (poly-Si gate) 20, and charge carrier region 14' is provided with another insulated electrode (poly-Si gate) 20'.

pn junctions 22 or 22' and 24 or 24' are formed due to the arrangement of charge carrier regions 12, 14, 16, and 12, 14', 16'.

Substrate 12 of the first type of conductivity is weakly doped, while charge carrier region 16 or 16' of the same type of conductivity is highly doped. Charge carrier regions 14 or 14' of the other type of conductivity is moderately doped. An antiserial configuration of two MOS transistors 26 or 26' is formed due to such an essentially known structure of semiconductor component 10.

In addition, a charge carrier region 28 extending into substrate 12 is provided for pn junction 22. Charge carrier region 28 has charge carriers of the same type of conductivity as substrate 12; it is, however, more highly doped.

Figure 2:
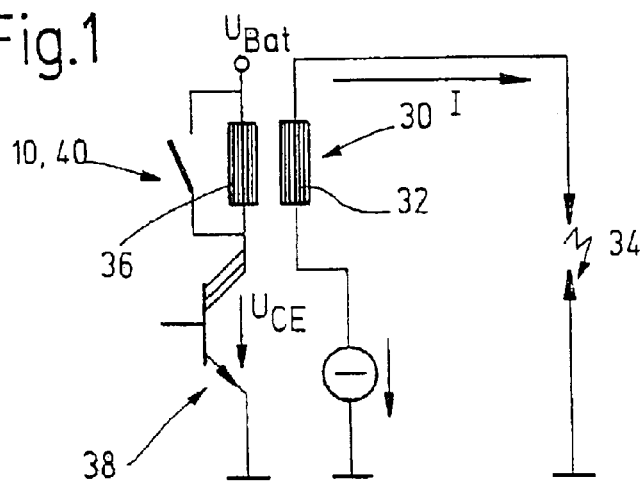
FIG. 2 shows a circuit arrangement of an ignition power module using the bidirectional semiconductor component according to the present invention.

Thus, the exemplary embodiment is of a bidirectional semiconductor component having two symmetrical MOS transistor structures integrated laterally in a substrate and connected antiserially, their drain terminals being connected to one another (as indicated in FIG. 2), in which a zone (28) having the same type of conductivity as the drain region yet a higher doping than that of the drain region (12) is situated upstream from a pn junction (22) of one of the MOS transistors (26) in a junction area with the drain region (12).

Use of semiconductor component 10 according to the present invention is illustrated on the basis of the circuit arrangement shown in FIG. 2, which shows an ignition power module of an ignition system of a motor vehicle. A secondary winding 32 of an ignition coil 30 is connected to a sparkplug 34 here. Primary winding 36 of ignition coil 30 is connected to a power supply voltage source formed by the automobile battery in the present application. Primary winding 36 is also connected to a switching element 38 by which primary winding 36 is connectable to the power supply voltage source. Switching element 38 is designed as a Darlington transistor stage, for example. A short-circuit switch 40 formed by bidirectional semiconductor component 10 according to the present invention is situated parallel to primary winding 36. Metallic coating 18 is connected here to switching element 38, and metallic coating 18' is connected to the power supply voltage source.

Semiconductor component 10 in combination with the circuit configuration illustrated in FIG. 2 has the following function:

A fuel-air mixture in a cylinder of an internal combustion engine may be ignited by sparkplug 34 in a known way. After the spark is extinguished, the gas mixture in the cylinder is still ionized. An ionic concentration prevailing here permits inferences regarding the combustion and knocking performance of the internal combustion engine in a known way. It is known that an accelerating voltage can be applied to the electrodes of sparkplug 34 to determine this ionic concentration, so that a resulting ionic current I forms a measure of the ionic concentration. For such a method of determining the ionic concentration, it is essential that the spark is extinguished in a defined manner after ignition of the fuel-air mixture, and ionic current I is measured immediately thereafter.

These prerequisites may be met by a low-resistance short-circuiting of primary winding 36 by semiconductor component 10 according to the present invention (switching element 40). The short circuit of primary winding 36 produces a defined extinguishing of the spark after ignition of the fuel-air mixture and minimizes the transformed serial impedance in the secondary side of the ignition circuit. This has a positive influence on the frequency response of the measurement circuit for measuring ionic current I.

To achieve defined extinguishing of the spark, a defined switching instant of semiconductor component 10 (short-circuiter 40) is required. Short-circuiter 40 is connected to power supply voltage $U_{Bat}$ and to terminal voltage $U_{CE}$ of switching transistor 38. The power supply voltage is approx. 14 V, while terminal voltage $U_{CE}$ is approx. 400 V. For this voltage difference, semiconductor component 10 is to have a blocking ability of approx. 400 V. This is achieved according to the present invention by the integration of charge carrier region 28 into semiconductor component 10.

If neither poly-Si gate (electrode) 20 nor poly-Si gate (electrode) 20' is triggered, then semiconductor component 10 is blocked for both polarities. This operating state exists when primary winding 36 receives current by triggering switching transistor 38. Electrodes 18' and 20' are at the power supply voltage level in this operating state, and pn junction 22 is in blocked polarity The doping of charge carrier regions 12 and 28 upstream from pn junction 22 is selected here so that the required blocking voltage is obtained when power supply voltage $U_{Bat}$ is applied.

When ignition transistor 38 is switched off, it goes into bracketing, so that the spark of sparkplug 34 is ignited then in a known way. Terminal voltage $U_{CE}$ thus amounts to approx. 400 V, so that electrodes 18 and 20 are ramped with the terminal voltage up to approx. 400 V. Semiconductor component 10 is to thus be capable of blocking this terminal voltage.

To extinguish the spark of sparkplug 34, semiconductor component 10 (short-circuiter 40) is switched by energizing electrode 20. As a result, semiconductor component 10 is first switched as a bidirectional switching element (IBGT). The voltage across the switch (i.e., between electrodes 18 and 18') is thus reduced to the static conducting-state voltage of semiconductor component 10, so that electrode 20 can also be triggered with a time lag. This changes the operating state of semiconductor component 10 to that of a MOS transistor having a finite differential resistance at the origin of its output characteristic.

Due to electrode 20' (gate for MOS transistor 26') being energized, a current flows from electrode 18' over charge carrier region 16' and into substrate 12 (drain region), so that charge carrier region 14 responds as an emitter and initiates minority charge carriers into substrate 12. This increases its conductivity. This results in a reduction in the voltage drop across semiconductor component 10, so that electrode 20 can then be energized as a gate of MOS transistor 26. This suppresses the emitter effect of charge carrier region 14, because a parallel current path is created from substrate 12 (drain) over charge carrier region 14 to charge carrier region 16. This results in tilting of the operating state of semiconductor component 10 from a bidirectional component (IGBT) to the operating state of a MOS transistor having sufficient conductivity.

Electrode 20 may either be triggered simultaneously with triggering of electrode 20' with an intermediate capacitance, or electrode 20 is triggered directly with a time offset from the triggering of electrode 20'. Either case results in triggering of the gate terminal of MOS transistor 26 after terminal voltage $U_{CE}$ has already been reduced. All in all, this permits a defined switching of semiconductor component 10 as short-circuiter 40 due to defined triggering of electrode 20' and electrode 20, resulting in a defined extinguishing of the spark of sparkplug 34.

Figure 3:
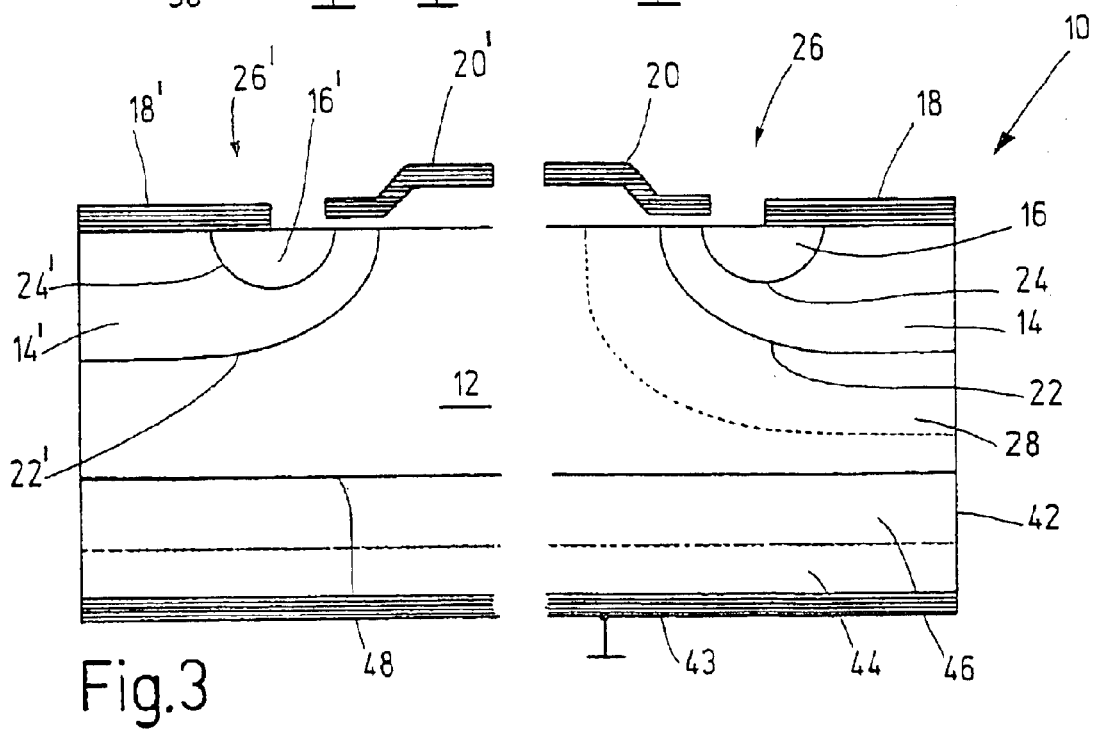
FIG. 3 shows a preferred embodiment of the bidirectional semiconductor component according to the present invention.

FIG. 3 shows a preferred embodiment of semiconductor component 10, the same parts as in FIG. 1 being provided with the same reference numbers and not explained again.

As FIG. 3 shows, substrate 12 is situated on a layer 42 having a doping opposite that of substrate 12 (i.e., P doping according to this example) to which ground potential 43 is connected. Layer 42 may be made of partial layers 44 and 46 having different charge carrier doping of the same type of conductivity. Due to the arrangement of layer 42, another pn junction 48 develops, its blocking voltage being determined by the doping of layer 42. Due to the stepwise doping of layers 44 and 46, the blocking voltage may be increased by using the resurf effect.

Due to the structuring of semiconductor component 10 illustrated in FIG. 3, it is possible to implement a resurf technology by which the structure of semiconductor component 10 may be achieved easily.

Due to the monolithically integrated structure of semiconductor component 10, forming short-circuiter 40, it can be accommodated easily in a monolithically integrated component together with switching transistor 38. This makes it possible to eliminate the arrangement of discrete switching elements. This yields fabrication advantages for the entire ignition circuit.

Figure 4:
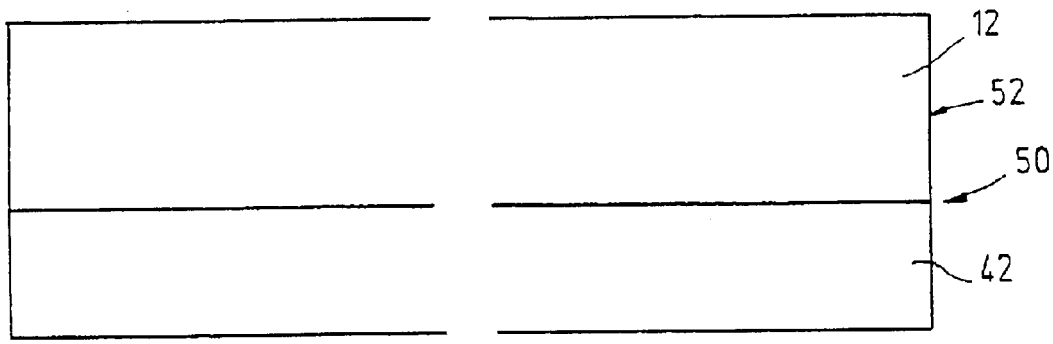
FIGS. 4, 5, and 6 show schematic process steps for manufacturing the bidirectional semiconductor component according to the exemplary embodiments of the present invention.
Figure 5:
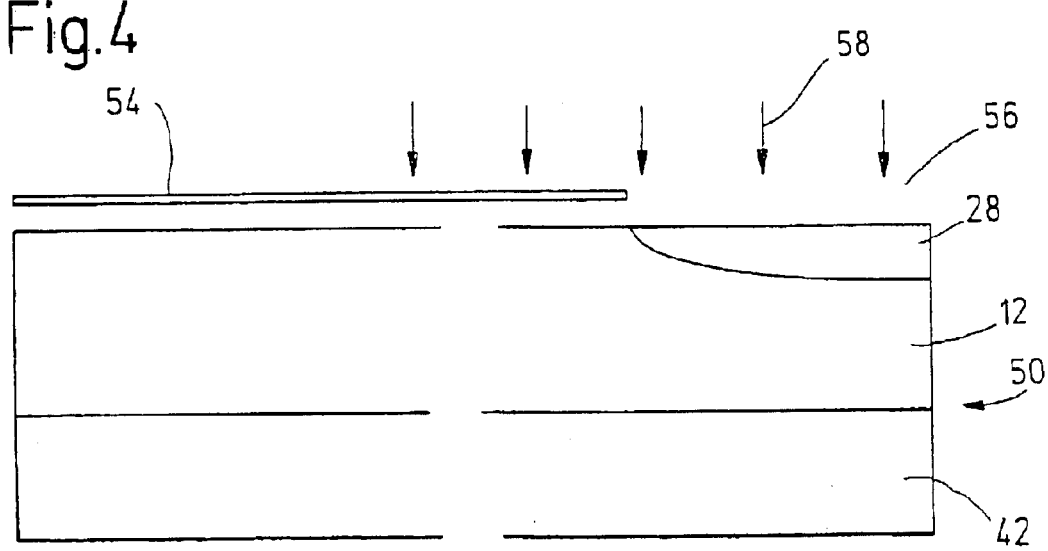
Figure 6:
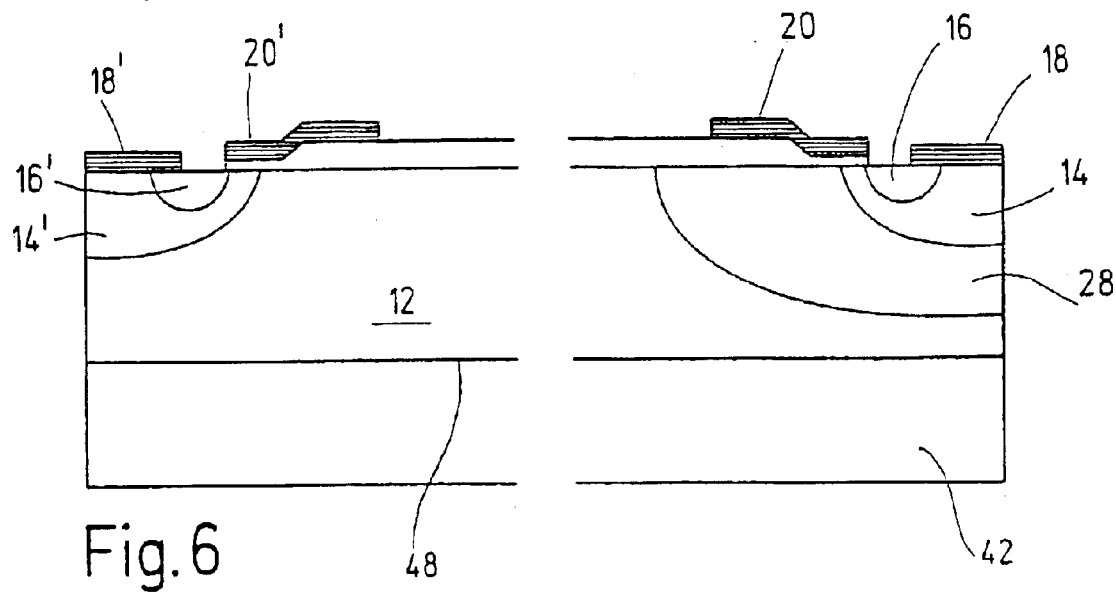

The manufacture of semiconductor component 10 is illustrated schematically on the basis of FIGS. 4 through 6.

First, as illustrated in FIG. 4, a drift layer with n-type doping is implanted in a starting wafer 50 having a p-type doping according to the doping of subsequent layer 42. This drift layer 52 having n-type doping corresponds to subsequent substrate 12. This processing is known as a standard smart power process.

Then as illustrated in FIG. 5, a mask 54 having a mask opening 56 in the area of subsequent charge carrier region 28 is situated above starting wafer 50. Then ion implantation 58 is performed with ions of n-type doping, resulting in the development of charge carrier region 28 within the substrate having n-type doping, charge carrier region 28 having a higher doping than substrate 12.

Then in method steps that are not shown in greater detail, all of them being standard method steps from the manufacture of integrated circuits, charge carrier regions 14, 14' or 16, 16' are implanted and electrodes 18, 18', 20 and 20' are applied. At the same time, other circuit components (not shown in greater detail here) are also manufactured, e.g., the control logic for triggering electrodes 20, 20', passivation layers, polysilicon layers, etc.

What is claimed is:

1. A bidirectional semiconductor component, comprising:

a substrate including a drain region; and two symmetrical MOS transistor structures integrated laterally in the substrate and connected to each other antiserially, a drain terminal of each of the two symmetrical MOS transistor structures being connected to one another, wherein:

a zone having a conductivity that is the same as a conductivity of the drain region and having a doping that is higher than a doping of the drain region is doped upstream from a pn junction of one of the two symmetrical MOS transistor structures in a junction area with the drain region.

2. The bidirectional semiconductor component according to claim 1, wherein:

the drain region and the zone are n-doped.

3. The bidirectional semiconductor component according to claim 1, further comprising:

a layer on which the drain region is situated and having a doping that is opposite that of the conductivity of the drain region.

4. The bidirectional semiconductor component according to claim 3, wherein:

the layer includes a plurality of partial layers having different doping of the same type of conductivity.

5. A method of using a bidirectional semiconductor component, comprising the step of:

using the bidirectional semiconductor component as a short-circuit switch to short circuit a primary winding of an ignition coil in an ignition power module of an ignition system of an internal combustion engine, wherein the bidirectional semiconductor component includes:

a substrate including a drain region; and two symmetrical MOS transistor structures integrated laterally in the substrate and connected to each other antiserially, a drain terminal of each of the two symmetrical MOS transistor structures being connected to one another wherein:

a zone having a conductivity that is the same as a conductivity of the drain region and having a doping that is higher than a doping of the drain region is doped upstream from a pn junction of one of the two symmetrical MOS transistor structures in a junction area with the drain region.

6. The method according to claim 5, further comprising the steps of:

performing a time-staggered activation of gate terminals of the two symmetrical MOS transistor structures in a time-staggered manner; and activating at a later time one of the two symmetrical MOS transistor structures that blocks a higher voltage of one of a battery voltage and a terminal voltage.

7. The method according to claim 6, wherein:

the time-staggered activation is performed by interconnecting a capacitor.

8. The method according to claim 6, wherein:

the time-staggered activation is performed by a time control.

* * * * *